United States Patent
Guo

(10) Patent No.: US 9,116,170 B2
(45) Date of Patent: Aug. 25, 2015

(54) AUTOMATIC ALIGNING APPARATUS

(71) Applicant: Wistron Corporation, New Taipei (TW)

(72) Inventor: Jan Hong Guo, New Taipei (TW)

(73) Assignee: Wistron Corporation, New Taipei (TW)

( * ) Notice: Subject to any disclaimer, the term of this patent is extended or adjusted under 35 U.S.C. 154(b) by 442 days.

(21) Appl. No.: 13/765,909

(22) Filed: Feb. 13, 2013

(65) Prior Publication Data

US 2014/0021975 A1    Jan. 23, 2014

(30) Foreign Application Priority Data

Jul. 18, 2012    (CN) .......................... 2012 1 0249567

(51) Int. Cl.
*G01R 1/04*    (2006.01)
*H01R 43/26*    (2006.01)
*H01R 13/631*    (2006.01)

(52) U.S. Cl.
CPC ................ *G01R 1/04* (2013.01); *G01R 1/0416* (2013.01); *H01R 43/26* (2013.01); *H01R 13/6315* (2013.01)

(58) Field of Classification Search
USPC .......... 324/750.24, 750.16, 156, 157, 756.01, 324/754.11, 750.25; 29/20, 466, 700; 361/679.01, 807, 802; 33/286, 533
See application file for complete search history.

(56) References Cited

U.S. PATENT DOCUMENTS

2004/0214460 A1 * 10/2004 Osawa et al. ................. 439/157
2009/0290950 A1    11/2009 Shen

* cited by examiner

*Primary Examiner* — Melissa Koval
*Assistant Examiner* — Nasima Monsur
(74) *Attorney, Agent, or Firm* — John A. Fortkort; Fortkort & Houston P.C.

(57) ABSTRACT

An automatic aligning apparatus for aligning aligning components of a first object with aligning components of a second object includes first and second aligning mechanisms. The first aligning mechanism carries the first object and has a guiding groove. The second aligning mechanism has a carrying component that carries the second object, two rear holding plates, and two connecting components, each extending through a through hole in a corresponding rear holding plate and having two clamping parts that clamp a corresponding rear holding plate. The carrying component is movable between an initial position and an aligning position where a guiding stud of the carrying component extends into the guiding groove.

18 Claims, 8 Drawing Sheets

AUTOMATIC ALIGNING APPARATUS

CROSS REFERENCE TO RELATED APPLICATION

This application claims priority of Chinese Application No. 201210249567.3, filed on Jul. 18, 2012, the entire disclosure of which is incorporated herein by reference.

FIELD OF THE INVENTION

The invention relates to an aligning apparatus, more particularly to an automatic aligning apparatus.

DESCRIPTION OF THE RELATED ART

A conventional detecting machine for detecting an electronic device generally includes a plurality of signal pins for electrically connecting to a plurality of connecting ports of the electronic device, so that test signals can be inputted through the signal pins of the machine into the connecting ports of the electronic device. The response of the electronic device to the test signals can be used to determine whether the connecting ports of the electronic device are functioning normally.

In the foregoing process, if the signal pins and the connecting ports are not accurately aligned and connected, the test signals may not be transmitted successfully, or, even worse, collisions between the signal pins and the connecting ports may occur due to misalignment therebetween, thereby causing fracture of the signal pins or damage to the connecting ports.

SUMMARY OF THE INVENTION

Therefore, an object of the present disclosure is to provide an automatic aligning apparatus for facilitating alignment between different objects.

Accordingly, an automatic aligning apparatus is adapted to align a plurality of first aligning components of a first object with a plurality of second aligning components of a second object. The automatic aligning apparatus comprises a first aligning mechanism and a second aligning mechanism. The first aligning mechanism has a rear surface that is formed with at least one guiding groove terminating at a cone-shaped groove end. The first aligning mechanism is adapted for carrying the first object. The second aligning mechanism is disposed behind the first aligning mechanism and includes a base, a holding frame, a carrying component, a pair of rear holding plates and a pair of connecting components. The holding frame is connected slidably to the base and is slidable in a front-rear direction relative to the base. The carrying component has a front carrying plate disposed movably on the holding frame, adapted for carrying the second object, and having a front face that confronts the first aligning mechanism and a rear face that is opposite to the front face in the front-rear direction, and at least one guiding stud projecting from the front face and having a cone-shaped distal portion. The rear holding plates are mounted on the holding frame, spaced apart from each other in a left-right direction transverse to the front-rear direction, and disposed behind and spaced apart from the rear face of the front carrying plate. Each of the rear holding plates is formed with at least one through hole that extends therethrough in the front-rear direction. Each of the connecting components is connected to the rear face of the front carrying plate, and has a shaft part extending along the front-rear direction, and first and second clamping parts extending radially and outwardly from an outer surface of the shaft part and spaced apart from each other in the front-rear direction. The first clamping part and the second clamping part are disposed respectively at the front and the rear of a respective one of the rear holding plates and cooperate with each other to clamp the respective one of the rear holding plates therebetween. The shaft part extends through the through hole of the respective one of the rear holding plates, and has a diameter smaller than the through hole of the respective one of the rear holding plates so as to be movable in directions transverse to the front-rear direction. The carrying component is movable together with the holding frame via the rear holding plates and the connecting components in the front-rear direction between an initial position, where the at least one guiding stud of the carrying component is separated from the at least one guiding groove of the first aligning mechanism, and an aligning position, where the at least one guiding stud extends into the at least one guiding groove so that the first aligning components of the first object are connected to the second aligning components of the second object, respectively.

BRIEF DESCRIPTION OF THE DRAWINGS

Other features and advantages of the present invention will become apparent in the following detailed description of the embodiment with reference to the accompanying drawings, of which.

DETAILED DESCRIPTION OF THE EMBODIMENT

Figure 1:
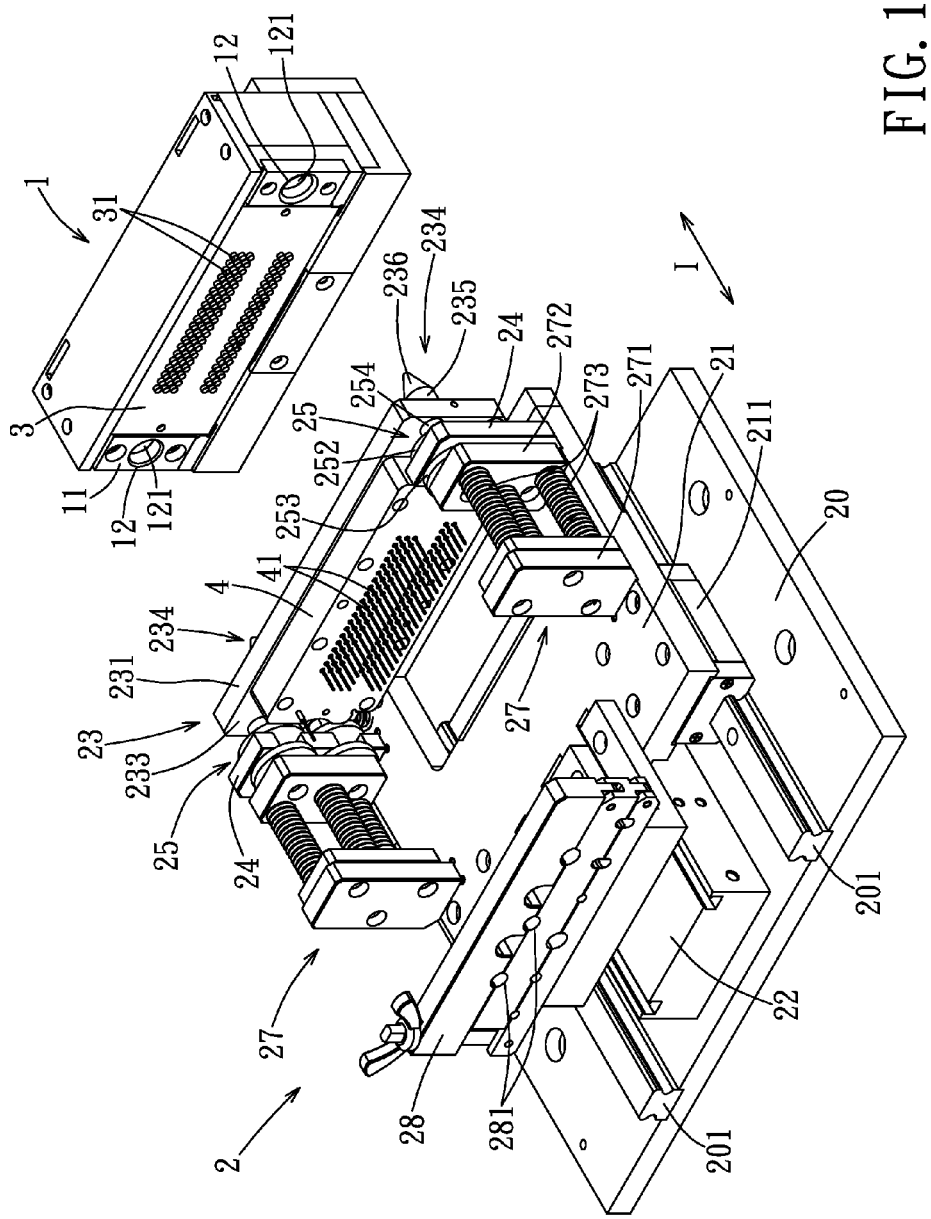
FIG. 1 is a perspective view illustrating an embodiment of an automatic aligning apparatus according to this invention.

Before the present invention is described in greater detail with reference to the accompanying embodiment, it should be noted herein that like elements are denoted by the same reference numerals throughout the disclosure.

Referring to FIGS. 1 to 4, the embodiment of an automatic aligning apparatus according to this invention is adapted to align a plurality of first aligning components 31 of a first object 3 with a plurality of second aligning components 41 of a second object 4. In the present embodiment, the first object 3 is an electronic device, and each of the first aligning components 31 is a signal connecting port. The second object 4 is a pin plate, and the second aligning components 41 are a plurality of signal pins extending through and fixed to the pin plate. Each of the second aligning components 41 is insertable into a corresponding first aligning component 31 of the first object 3.

The automatic aligning apparatus comprises a first aligning mechanism 1 and a second aligning mechanism 2. The first aligning mechanism 1 has a rear surface 11 formed with a pair of spaced-apart guiding grooves 12, each of which terminates at a cone-shaped groove end. The first aligning mechanism 1 is adapted for carrying the first object 3 such that a rear surface of the first object 3 is aligned with the rear surface 11 of the first aligning mechanism 1.

The second aligning mechanism 2 is disposed behind the first aligning mechanism 1 and includes a base 20, a holding frame 21 connected slidably to the base 20 and slidable in a front-rear direction (I) relative to the base 20, a cylinder 22 mounted on the base 20 and connected to the holding frame 21 for driving the same to slide in the front-rear direction (I), a carrying component 23, a pair of rear holding plates 24 mounted on the holding frame 21, and four connecting components 25. The second aligning mechanism 2 further includes a pair of slide rails 201 mounted on a top side of the base 20 and extending in the front-rear direction (I). The holding frame 21 includes a pair of slide connecting members 211 engaged respectively and slidably with the slide rails 201. Therefore, the holding frame 21 can be driven by the cylinder 22 to slide reciprocally and smoothly in the front-rear direction (I).

The carrying component 23 has a front carrying plate 231 that abuts movably against top of the holding frame 21, that is adapted for carrying the second object 4, and that has a front face 232 confronting the first aligning mechanism 1 and a rear face 233 opposite to the front face 232 in the front-rear direction (I). The carrying component 23 further has a pair of guiding studs 234. Each of the guiding studs 234 projects from the front face 232 and has a cone-shaped distal portion corresponding in shape to the cone-shaped groove end of a corresponding one of the guiding grooves 12. Specifically, each of the guiding studs 234 includes a stud body 235 and a guide cone 236. The stud body 235 is connected to the front carrying plate 231, and the guide cone 236 extends from a distal end of the stud body 235. Each of the guiding studs 234 has a length in the front-rear direction (I) that is longer than the part of each second aligning component 41 that projects out of the front face 232 of the front carrying plate 231. In this embodiment, each guide cone 236 can be received fittingly in the corresponding guide groove 12 so that the position of the front carrying plate 231 can be quickly and accurately adjusted during movement of the front carrying plate 231 in the front-rear direction (I) toward the first aligning mechanism 1 and the second aligning components 41 of the second object 4 can be accurately aligned respectively with the first aligning components 31 of the first object 3. The stud body 235 and the guide cone 236 of each of the guide studs 234 may be molded as one piece in other embodiments of this invention.

Figure 5:
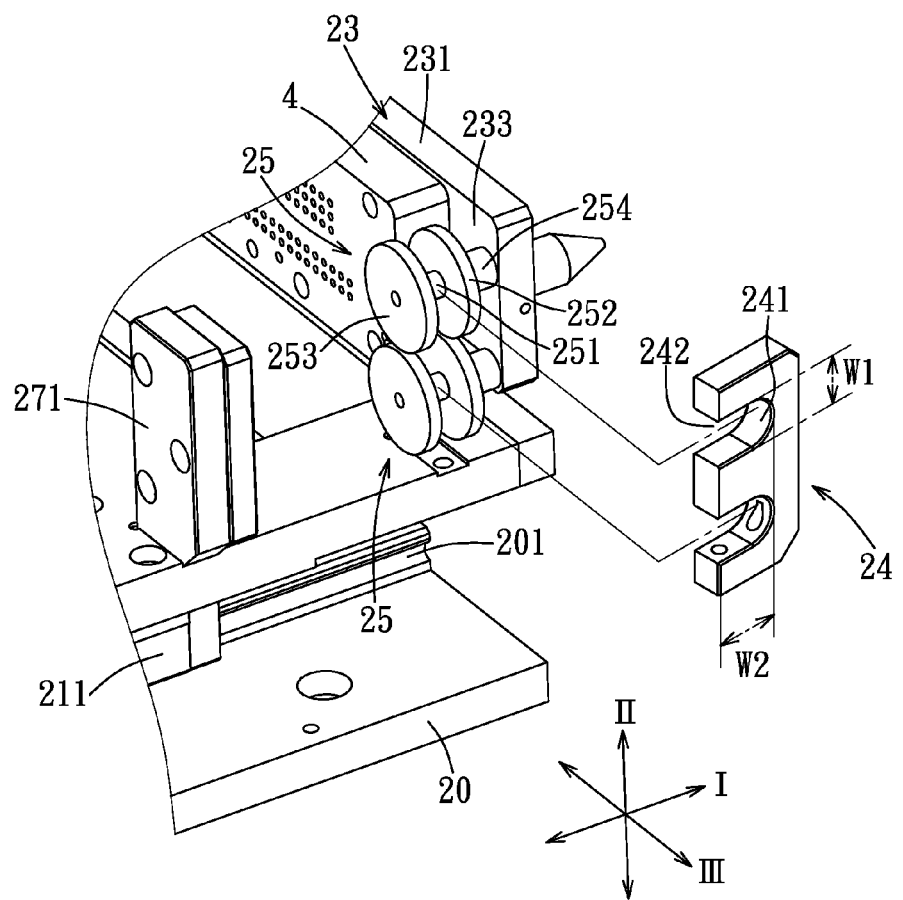
FIG. 5 is a fragmentary, partly exploded, perspective view illustrating a rear holding plate of the embodiment being formed with a plurality of through holes.

The two rear holding plates 24 are spaced apart from each other in a left-right direction (III) (see FIG. 5) transverse to the front-rear direction (I), disposed behind and spaced apart from the rear face 233 of the front carrying plate 23, and fixed to the holding frame 21 via, for example, fasteners. Referring to FIG. 5, each of the rear support plates 24 is E-shaped and is formed with a pair of through holes 241 extending therethrough in the front-rear direction (I). Each of the through holes 241 has a first length (W1), a second length (W2), and a lateral opening 242. The first length (W1) extends in a top-down direction (II) transverse to both the front-rear direction (I) and the left-right direction (III). The second length (W2) extends in the left-right direction (III). The lateral openings 242 of each of the rear holding plates 24 open toward those of the other one of the rear holding plates 24.

Referring to FIGS. 1 and 5, each of the connecting components 25 is connected to the rear face 233 of the carrying component 23, and has a shaft part 251 extending along the front-rear direction (I), a first clamping part 252 and a second clamping part 253 extending radially and outwardly from an outer surface of the shaft part 251 and spaced apart from each other in the front-rear direction (I), and a connecting part 254 protruding from the first clamping part 252 and connected to the rear face 233 of the front carrying plate 231. The first clamping part 252 and the second clamping part 253 are disposed respectively at the front and the rear of a respective one of the rear holding plates 24 and cooperate with each other to clamp the respective one of the rear holding plates 24 therebetween. Each of the connecting parts 254 is column-shaped and is fixed to the rear face 233 of the front carrying plate 231 such that the corresponding one of the connecting components 25 is coupled fixedly to the front carrying plate 231. The shaft part 251 of each of the connecting components 25 extends through a corresponding one of the through holes 241 of a corresponding one of the rear holding plates 24 via the corresponding lateral opening 242. The shaft part 251 of each of the connecting components 25 has a diameter smaller than both the first length (W1) and the second length (W2) of the corresponding one of the through holes 241. Since each of the rear holding plates 24 is clamped by the corresponding first and second clamping parts 252, 253, the shaft part 251 is prevented from inclining with respect to the top-down direction (II) and the left-right direction (III), and is movable only in directions transverse to the front-rear direction (I). By virtue of the connecting components 25, when the holding frame 21 drives the rear holding plates 24 along the front-rear direction (I), the front carrying plate 231 also moves in the same direction.

It should be noted that the number of guiding studs 234 of the carrying component 23 and the number of corresponding guiding grooves 12 of the first aligning mechanism 1 are not limited to two as disclosed in the present embodiment. Other embodiments of this invention may use more or fewer guiding studs 234 and guiding grooves 12. Moreover, each of the rear holding plates 24 may be formed with just one through hole 241, and the second aligning mechanism 2 may include only two connecting components 25 engaged respectively with the two through holes 241 of the rear holding plates 24 accordingly.

Figure 2:
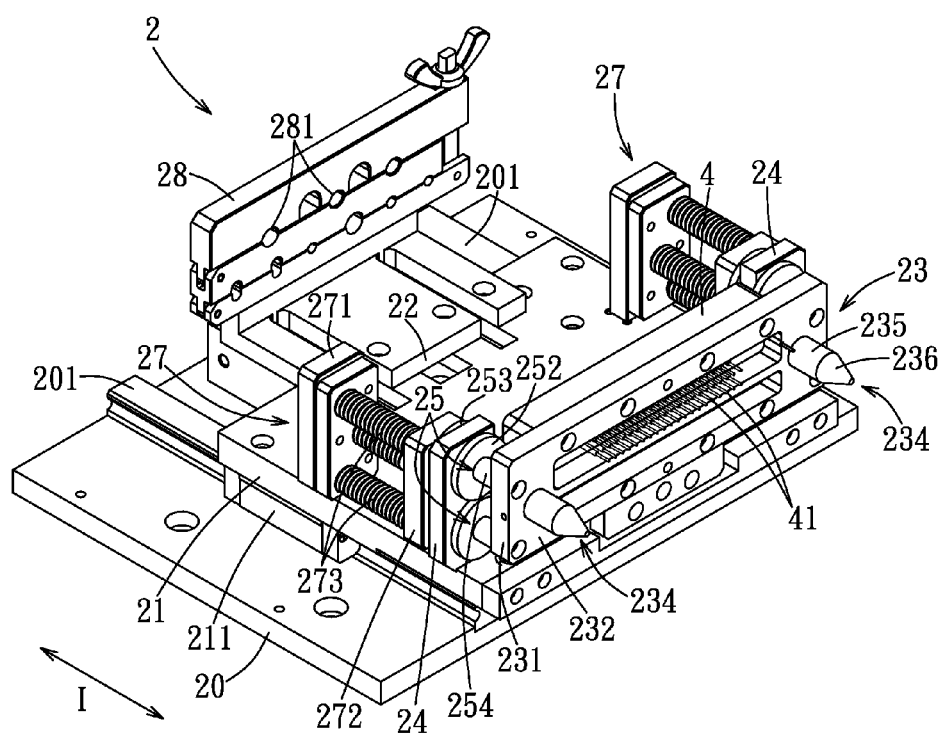
FIG. 2 is a perspective view illustrating a second aligning mechanism of the embodiment.
Figure 3:
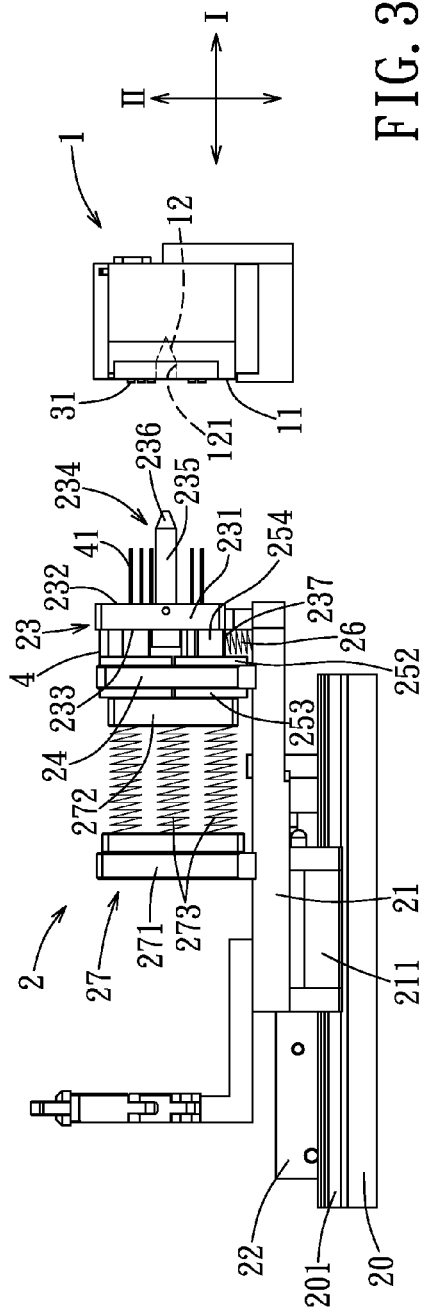
FIG. 3 is a side view illustrating a carrying component of the embodiment at an initial position.
Figure 4:
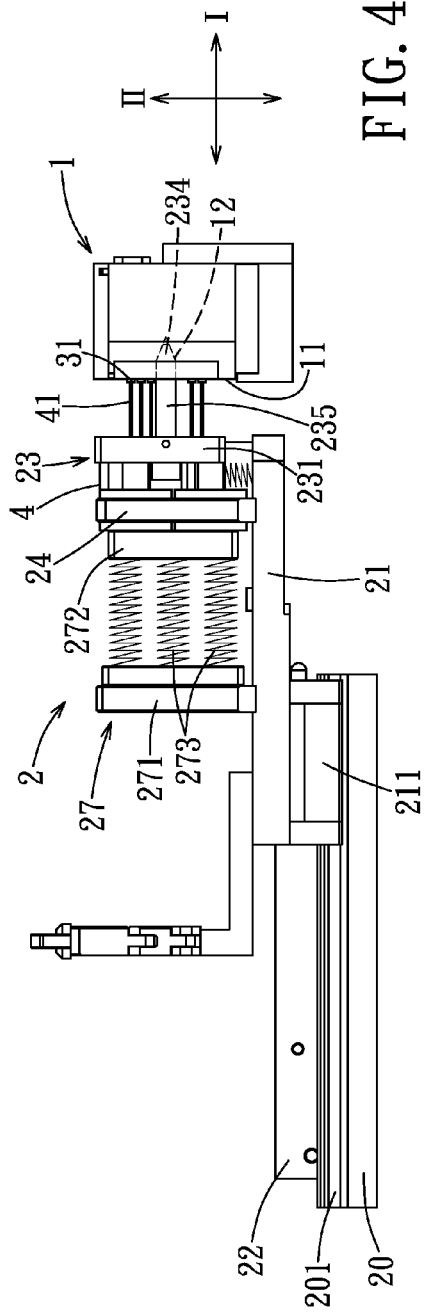
FIG. 4 is a side view illustrating the carrying component of the embodiment at an aligning position.

Referring to FIGS. 2 to 4, in this embodiment, the carrying component 23 further has a pair of protruding plates 237 extending rearward from the rear face 233. Each of the protruding plates 237 abuts against a bottom side of the connecting part 254 of a respective one of the connecting components 25. The second aligning mechanism 2 further includes a pair of support springs 26 and a pair of resilient connecting elements 27. Each of the support springs 26 is a compression spring that extends in the top-down direction (II) and that has an upper end and a lower end abutting respectively against a bottom side of a respective one of the protruding plates 237 of the carrying component 23 and the holding frame 21. Each of the support springs 26 provides an upward supporting force against both the carrying component 23 and the corresponding one of the connecting components 25 so that the carrying component 23 is more firmly mounted on the holding frame 21. When the carrying component 23 is displaced relative to the rear holding plates 24, each support spring 26 provides a restorative force for returning the carrying component 23 to its original position.

Each of the resilient connecting elements 27 is connected between the holding frame 21 and the second clamping part 253 of a respective one of the connecting components 25, and includes a fixing piece 271 fixed to the holding frame 21, a board piece 272 connected to the second clamping part 253 of the respective one of the connecting components 25, and a plurality of (three in this embodiment) connecting springs 273 interconnecting the fixing piece 271 and the board piece 272. In this embodiment, each of the connecting springs 273 is an extension spring extending in the front-rear direction (I). When the carrying component 23 is displaced relative to the rear holding plates 24, the connecting springs 273 are expanded and thus provide restoring forces to return the carrying component 23 to its original position. It is worth mentioning that each of the resilient connecting elements 27 may include only one connecting spring 273.

Figure 6:
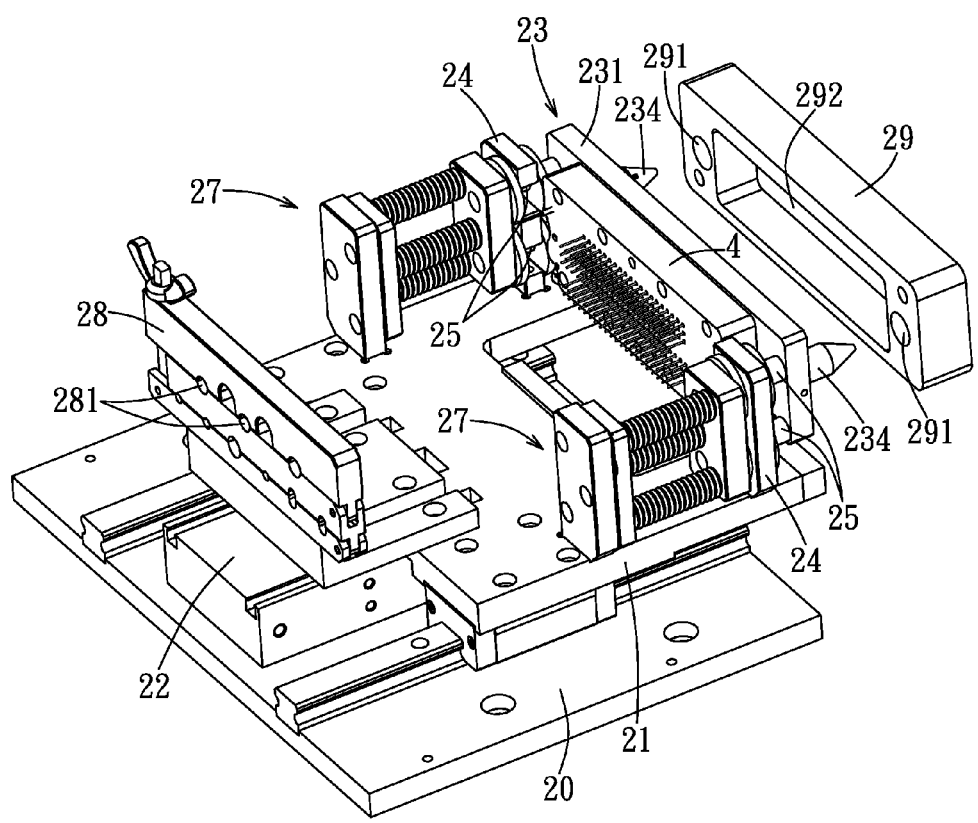
FIG. 6 is an exploded perspective view illustrating the second aligning mechanism and a protective cover.

Referring to FIGS. 3, 4 and 6, the second aligning mechanism 2 further includes a cable arrangement member 28 mounted at a rear of the connecting components 25 and a detachable protective cover 29 for covering the front face 232 of the front carrying plate 231. The cable arrangement member 28 is formed with a plurality of cable management holes 281 for extension of a plurality of signal transmission lines (not shown) that are connected to the second aligning components 41 (that is, signal pins) so as to prevent those signal transmission lines from being entangled with one another. The protective cover 29 has a rear side formed with a pair of fixing holes 291 for being engaged removably with the guiding studs 234 when the carrying component 23 is separated from the first aligning mechanism 1 and a protective slot 292 for receiving front parts of the second aligning components 41 (signal pins). When the automatic aligning apparatus is not in use, the protective cover 29 can be used to cover the front face 232 of the front carrying plate 231 to protect the second aligning components 41 and the guiding studs 234.

Referring to FIGS. 1 to 4, by virtue of the two rear holding plates 24 and the four connecting components 25, the holding frame 21 can drive the carrying component 23 to move in the front-rear direction (I) reciprocally between an initial position as shown in FIG. 3 and an aligning position as shown in FIG. 4. When the carrying component 23 is at the initial position, the guiding studs 234 are separated from the guiding grooves 12 so that the first aligning components 31 of the first object 3 are spaced apart from the second aligning components 41 of the second object 4.

When the cylinder 22 drives the holding frame 21 toward the first aligning mechanism 1 in the front-rear direction (I), the holding frame 21 moves the carrying component 23 from the initial position to the aligning position, the guiding studs 234 extend respectively into the guiding grooves 12, and the guide cone 236 of each of the guiding studs 234 contacts an inner cone surface 121, which defines the cone-shaped groove end of the corresponding one of the guiding grooves 12 and guides tips of the guide cones 236 to align respectively with the ends of the cone-shaped groove ends of the guiding grooves 12. Simultaneously, the front carrying plate 231 carries the connecting components 25 in the directions transverse to the front-rear direction (I) to align with the first aligning mechanism 1, thereby aligning the second aligning components 41 of the second object 4 which are mounted on the front carrying plate 231 with the first aligning components 31 of the first object 3 respectively. This allows the second aligning components 41 to accurately and electrically connect to the first aligning components 31, thereby allowing smooth transmission of the test signals from the second aligning components 41 to the first aligning components 31 for detecting whether the functionalities of the first aligning components 31 are normal.

Figure 7:
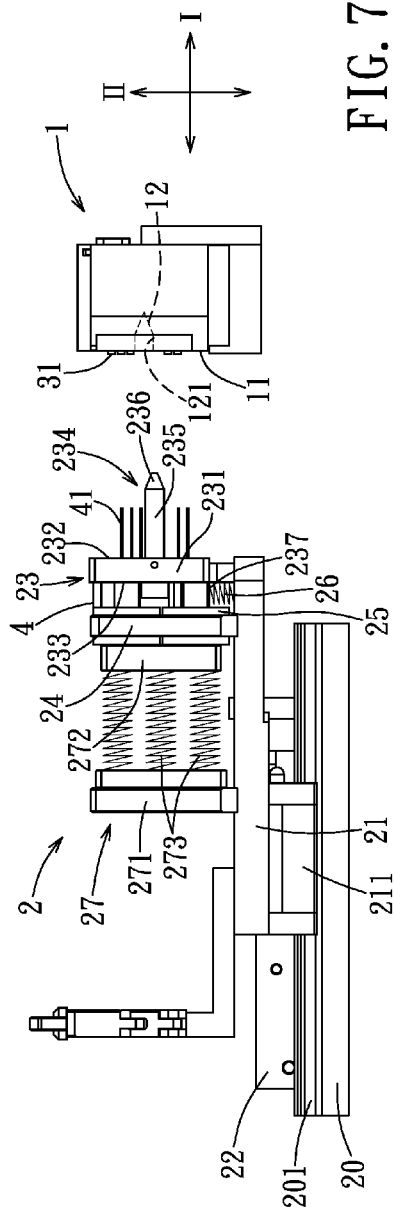
FIG. 7 is a side view illustrating the carrying component of the embodiment at another initial position.
Figure 8:
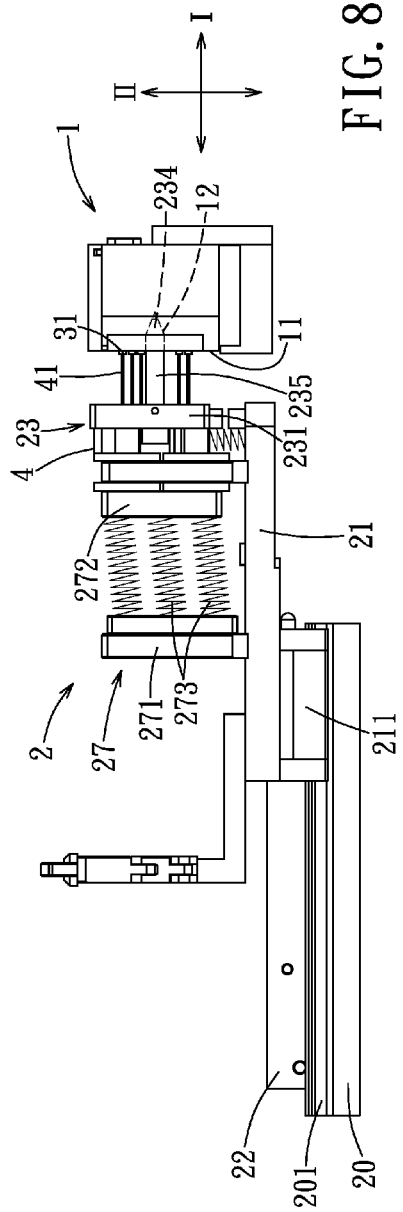
FIG. 8 is another side view illustrating the carrying component of the embodiment being moved from the another initial position to the aligning position.

It should be noted that, as shown in FIGS. 7 and 8, when the level of the guide cones 236 is lower than that of the guiding grooves 12, the front carrying plate 231 will drive the connecting components 25 upward in the top-down direction (II) so that the shaft part 251 of each of the connecting components 25 moves upward in the corresponding one of the through holes 241 (as shown in FIG. 5). In the meantime, each of the connecting components 25 will pull upward, also pulling the corresponding board piece 272 in the same direction, thereby expanding the corresponding connecting springs 273.

Figure 9:
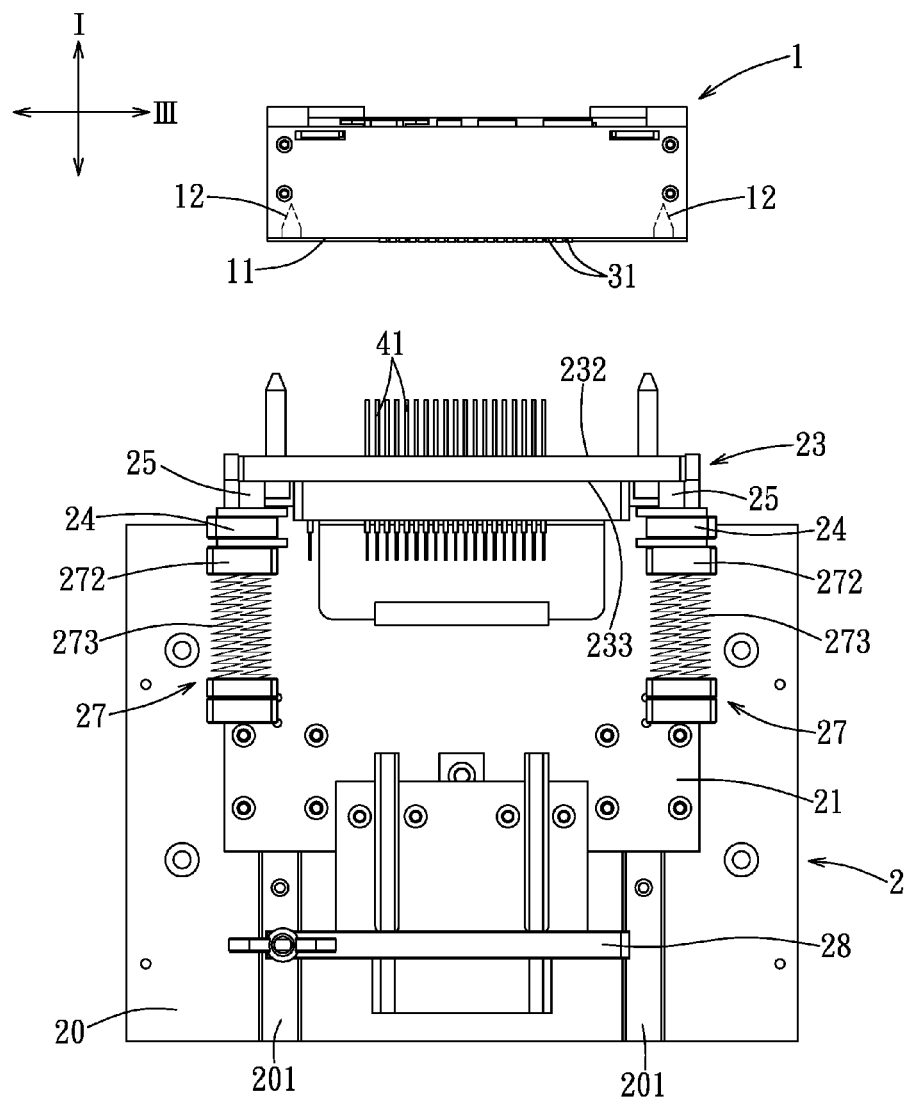
FIG. 9 is a top view illustrating the carrying component of the embodiment at another initial position.
Figure 10:
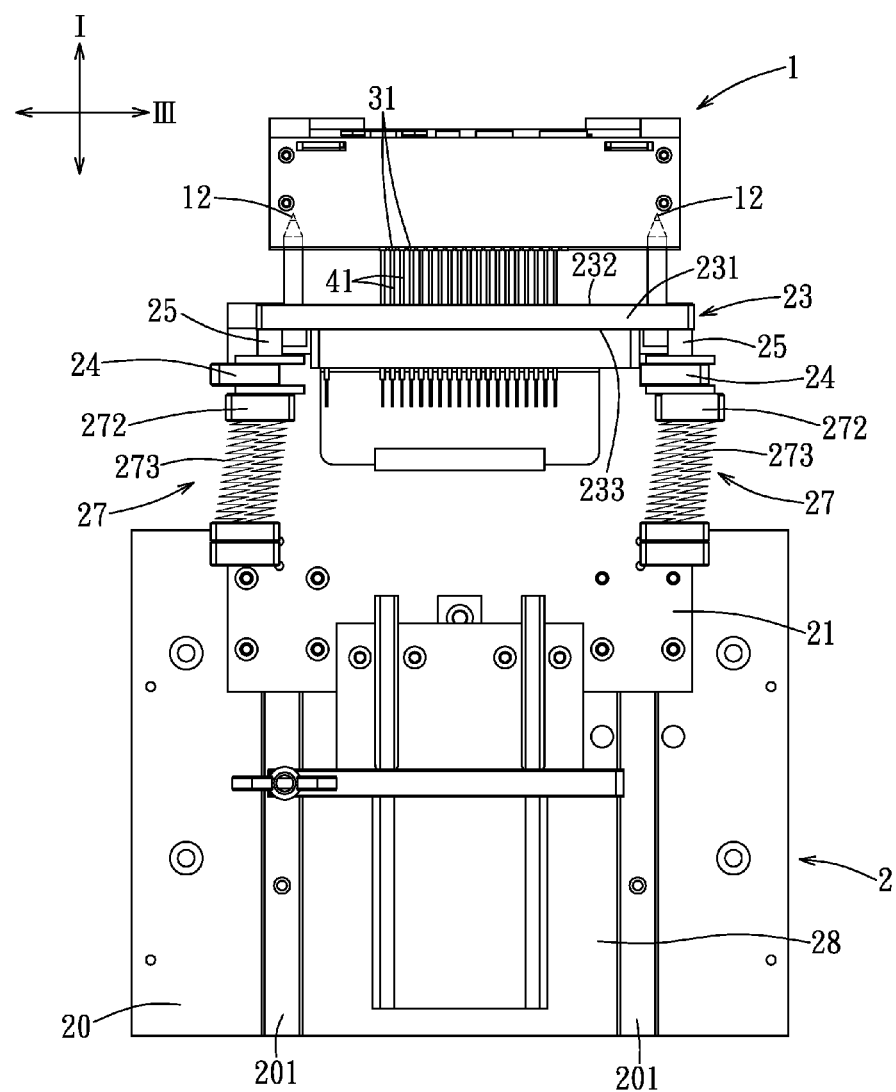
FIG. 10 is a top view illustrating the carrying component of the embodiment being driven to move in a left-right direction and to the aligning position.

As shown in FIGS. 9 and 10, when the position of the guide cones 236 is deviated to a left side relative to the guiding grooves 12, the front carrying plate 231 will move right in the left-right direction (III) together with the connecting components 25 so that the shaft part 251 of each of the connecting components 25 moves right in the corresponding one of the through holes 241 (as shown in FIG. 5). In the meantime, each of the connecting components 25 will pull right, also pulling the corresponding board piece 272 in the same direction, thereby expanding the corresponding connecting springs 273. Similarly, when the front carrying plate 231 drives the connecting components 25 to move in any other direction that is transverse the front-rear direction (I), the shaft part 251 of each of the connecting components 25 moves in the same direction in the corresponding one of the through holes 241 and moves the corresponding board piece 272 in the same direction, thereby expanding the corresponding connecting springs 273.

In the foregoing deformation states, when the cylinder 22 drives the holding frame 21 to move the carrying component 23 from the aligning position back to the initial position, the restoring force of the support springs 26 and the connecting springs 273 returns the carrying component 23 to its original position.

The design of retaining the shaft part 251 of each of the connecting components 25 in the through hole 241 of the corresponding rear holding plates 24, during the process in which the guiding studs 234 of the carrying component 23 are extended into the guiding grooves 12 enables the carrying component 23 to carry the second object 4 in directions transverse to the front-rear direction (I) so that the tips of the guide cones 236 can be precisely and respectively aligned with the ends of the cone-shaped groove ends of the guiding grooves 12, thereby ensuring the accuracy of alignment. The design, therefore, allows the second aligning components 41 of the second object 4 to accurately and respectively extend into the first aligning components 31 of the first object 3.

In sum, through the design of disposing the shaft part 251 of each of the connecting components 25 in the through hole 241 of the corresponding rear holding plates 24 such that the shaft part 251 in movable in any direction that is transverse the front-rear direction (I), and through the guidance function of the guiding studs 234 and the guiding grooves 12 during engagement therebetween, the carrying component 23 can move in directions transverse to the front-rear direction (I) during the movement from the initial position to the aligning position and carry the second aligning components 41 of the second object 4 to be accurately aligned with and to completely contact the first aligning components 31 of the first object 3. Therefore, collision between the second aligning components 41 and the first aligning components 31 due to misalignment therebetween can be avoided.

While the present invention has been described in connection with what is considered the most practical embodiment, it is understood that this invention is not limited to the disclosed embodiment but is intended to cover various arrangements included within the spirit and scope of the broadest interpretation so as to encompass all such modifications and equivalent arrangements.

What is claimed is:

1. An automatic aligning apparatus adapted to align a plurality of first aligning components of a first object with a plurality of second aligning components of a second object, said automatic aligning apparatus comprising:
   a first aligning mechanism having a rear surface that is formed with at least one guiding groove terminating at a cone-shaped groove end, said first aligning mechanism being adapted for carrying the first object; and
   a second aligning mechanism disposed behind said first aligning mechanism and including
      a base,
      a holding frame that is connected slidably to said base and that is slidable in a front-rear direction relative to said base,
      a carrying component that has
         a front carrying plate abutting movably against top of said holding frame, said front carrying plate being adapted for carrying the second object and having a front face that confronts said first aligning mechanism and a rear face that is opposite to said front face in the front-rear direction, and
         at least one guiding stud projecting from said front face and having a cone-shaped distal portion,
      a pair of rear holding plates that are mounted on said holding frame, that are spaced apart from each other in a left-right direction transverse to the front-rear direction, and that are disposed behind and spaced apart from said rear face of said front carrying plate, each of said rear holding plates being formed with at least one through hole that extends therethrough in the front-rear direction, and
      a pair of connecting components, each of which is connected to said rear face of said front carrying plate, and has a shaft part that extends in the front-rear direction and first and second clamping parts that extend radially and outwardly from an outer surface of said shaft part and that are spaced apart from each other in the front-rear direction, said first clamping part and said second clamping part being disposed respectively at front and rear of a respective one of said rear holding plates and cooperating with each other to clamp the respective one of said rear holding plates therebetween, said shaft part extending through said through hole of the respective one of said rear holding plates and having a diameter smaller than said through hole of the respective one of said rear holding plates so as to be movable in directions transverse to the front-rear direction;
   wherein said carrying component is movable together with said holding frame via said rear holding plates and said connecting components in the front-rear direction between an initial position, where said at least one guiding stud of said carrying component is separated from said at least one guiding groove of said first aligning mechanism, and an aligning position, where said at least one guiding stud extends into said at least one guiding groove so that the first aligning components of the first object are connected to the second aligning components of the second object, respectively.

2. The automatic aligning apparatus as claimed in claim 1, wherein each of said through holes has a first length in a top-down direction transverse to the front-rear direction and the left-right direction, the diameter of said shaft part of each of said connecting components being smaller than the first length.

3. The automatic aligning apparatus as claimed in claim 2, wherein said second aligning mechanism further includes a pair of support springs, each of which has opposite ends abutting respectively against said carrying component and said holding frame.

4. The automatic aligning apparatus as claimed in claim 3, wherein each of said support springs is a compression spring extending in the top-down direction and having an upper end and a lower end abutting against said carrying component and said holding frame, respectively.

5. The automatic aligning apparatus as claimed in claim 4, wherein each of said connecting components further has a connecting part protruding from said first clamping part of a corresponding one of said connecting components and connected to said rear face of said front carrying plate, said carrying component further having a pair of protruding plates extending rearward from said rear face, each abutting against a bottom side of said connecting part of a respective one of said connecting components, said upper end of each of said support springs abutting against a bottom side of a respective one of said protruding plates.

6. The automatic aligning apparatus as claimed in claim 1, wherein each of said through holes has a second length in the left-right direction, the diameter of said shaft part of each of said connecting components being smaller than the second length.

7. The automatic aligning apparatus as claimed in claim 1, wherein said second aligning mechanism further includes a pair of resilient connecting elements, each of said resilient connecting elements being connected between said holding frame and said second clamping part of a respective one of said connecting components.

8. The automatic aligning apparatus as claimed in claim 7, wherein each of said resilient connecting elements includes:
   a fixing piece fixed to said holding frame;
   a board piece connected to said second clamping part of the respective one of said connecting components; and
   at least one connecting spring interconnecting said fixing piece and said board piece and configured as an extension spring that extends in the front-rear direction.

9. The automatic aligning apparatus as claimed in claim 2, wherein each of said through holes has a second length in the left-right direction, the diameter of said shaft part of each of said connecting components being smaller than the second length.

10. The automatic aligning apparatus as claimed in claim 9, wherein said through hole of each of said rear holding plates has a lateral opening that opens toward the other one of said rear holding plates.

11. The automatic aligning apparatus as claimed in claim 9, wherein said second aligning mechanism further includes a pair of resilient connecting elements and a pair of support springs, each of said resilient connecting elements being connected between said holding frame and said second clamping part of a respective one of said connecting components, each of said support springs having opposite ends abutting respectively against said holding frame and said carrying component.

12. The automatic aligning apparatus as claimed in claim 11, wherein:
   each of said resilient connecting elements includes a fixing piece fixed to said holding frame, a board piece connected to said second clamping part of the respective one of said connecting components, and at least one connecting spring interconnecting said fixing piece and said board piece and configured as an extension spring that extends in the front-rear direction; and each of said support springs is configured as a compression spring that extends in the top-down direction and that has upper and lower ends abutting respectively against said carrying component and said holding frame.

13. The automatic aligning apparatus as claimed in claim 12, wherein each of said connecting components further has a connecting part protruding from said first clamping part of a corresponding one of said connecting components and connected to said rear face of said front carrying plate, said carrying component further having a pair of protruding plates extending rearward from said rear face, each abutting against a bottom side of said connecting part of a respective one of said connecting components, said upper end of each of said support springs abutting against a bottom side of a respective one of said protruding plates.

14. The automatic aligning apparatus as claimed in claim 1, wherein said second aligning mechanism further includes a cylinder mounted on said base for driving said holding frame to slide along the front-rear direction.

15. The automatic aligning apparatus as claimed in claim 1, wherein said second aligning mechanism further includes a cable arrangement member mounted at a rear of said connecting components, and formed with a plurality of cable management holes that are adapted for extension of a plurality of transmission cables connected to the second aligning components of the second object.

16. The automatic aligning apparatus as claimed in claim 1, further comprising a protective cover for covering removably said front face of said front carrying plate when said carrying component is at the initial position, said protective cover having a rear side formed with at least one fixing hole for being engaged removably with said at least one guiding studs when said carrying component is at the initial position, and a protective slot adapted for receiving the second aligning components of the second object when said carrying component is at the initial position.

17. The automatic aligning apparatus as claimed in claim 1, wherein said second aligning mechanism further includes a pair of slide rails mounted on said base and extending in the front-rear direction, said holding frame of said second aligning mechanism including a pair of slide connecting members that are engaged respectively and slidably with said slide rails.

18. The automatic aligning apparatus as claimed in claim 1, wherein said rear surface of said first aligning mechanism is formed with a pair of spaced-apart guiding grooves, and said carrying component of said second aligning mechanism has a pair of spaced-apart guiding studs.

* * * * *